United States Patent [19]
Yang et al.

[11] Patent Number: 5,930,322
[45] Date of Patent: Jul. 27, 1999

[54] DIVIDE-BY-4/5 COUNTER

[75] Inventors: Ching-Yuan Yang, Mialoi Hsien; Shen-Iuan Liu, Keelung, both of Taiwan

[73] Assignee: National Science Council, Taipei, Taiwan

[21] Appl. No.: 08/959,025

[22] Filed: Oct. 28, 1997

[30] Foreign Application Priority Data

Oct. 2, 1997 [TW] Taiwan .................................. 86114400

[51] Int. Cl.⁶ ................................................ H03K 21/00
[52] U.S. Cl. ................................ 377/48; 377/47; 327/115
[58] Field of Search ........................ 377/47, 48; 327/115, 327/117

[56] References Cited

U.S. PATENT DOCUMENTS

| | | | |
|---|---|---|---|
| 5,424,074 | 6/1995 | Koli et al. ................................ | 424/464 |
| 5,530,407 | 6/1996 | Yabe et al. ................................ | 331/44 |
| 5,594,703 | 1/1997 | Olivo et al. ......................... | 365/230.06 |
| 5,684,971 | 11/1997 | Martell et al. ........................... | 395/393 |
| 5,729,179 | 3/1998 | Sumi ........................................ | 331/12 |
| 5,854,755 | 12/1998 | Park et al. .............................. | 364/703 |

OTHER PUBLICATIONS

Patrik Larsson, High–Speed Architecture for a Programmable Frequency Divider and a Dual–Modulus Prescaler, IEEE Journal of Solid–State Circuits, vol. 31, No. 5, May 1996, pp. 744–748.

Byungsoo Chang et al., A 1.2 CHz CMOS Dual–Modulus Prescaler Using New Dynamic D–Type Flip–Flops, IEEE Journal of Solid–State Circuits, vol. 31, No. 5, May 1996, pp. 749–752.

Jiren Yuan et al., High–Speed CMOS Circuit Technique, IEEE JSSC, Feb. 1989, pp. 39–47.

J.–R. Yuan et al., Fast CMOS Nonbinary Divider and Counter, Electronics Letters, vol. 29, No. 13, Jun. 24, 1993, pp. 1222–1223.

J.–R. Yuan, Efficient CMOS Counter Circuits, Electronics Letters, vol. 24, No. 21, Oct. 13, 1988, pp. 1311–1313.

*Primary Examiner*—Terry D. Cunningham
*Assistant Examiner*—Maria Hasanzadah
*Attorney, Agent, or Firm*—Harness, Dickey & Pierce, P.L.C.

[57] ABSTRACT

A divide-by-4/5 counter includes a half transparent register, a domino logic, a buffer, a divide-by-4 counter and a control circuit. The half transparent register includes first, second, and third NMOS and PMOS transistors and first and second inverters. The domino logic includes fourth PMOS and NMOS transistors and first and second switches. The buffer is connected to a drain of the fourth PMOS transistor for out putting a reference clock signal. The divide-by-4 counter includes two divide-by-2 counters to obtain a divide-by-2 clock signal and an output clock signal. The control circuit is connected to a control terminal of the second switch for outputting a control signal of the domino logic according to the divide-by-2 clock signal, the output clock signal and a divide-by-4/5 control signal.

9 Claims, 4 Drawing Sheets

DIVIDE-BY-4/5 COUNTER

FIELD OF THE INVENTION

The present invention relates in general to a counter, and in particular, to a high-speed dual-modulus divide-by-4/5 counter, which can operate with low-power consumption at low operating voltage, and can be easily integrated into CMOS technologies.

BACKGROUND OF THE INVENTION

In modern communication systems, it is very important to provide a synthesizer with a high-speed prescaler. Usually, high-speed prescalers are integrated into BJT technologies or AsGa technologies. However, with the progress of CMOS technology, which provides higher integration density, lower power consumption and faster operating speed, a prescaler using CMOS technology has been provided.

FIG. 1 (Prior Art) is a circuit diagram of a conventional divide-by-128/129 counter using CMOS technologies. The divide-by-128/129 counter comprises a high-speed divide-by-4/5 counter K1, a low-speed divide-by-32 counter K2, and a control circuit K3. The high-speed divide-by-4/5 counter K1 is a logic circuit derived from the state diagram, in which three D flip-flops D1, D2, D3 and two NAND gates NA1, NA2 are connected as in FIG. 1. A divide-by-4/5 control signal MC is provided to control the input clock divided by 4 or by 5. The low-speed divide-by-32 counter K2 is formed by serially connecting five T flip-flops T1, T2, T3, T4, T5 (a T flip-flop can be obtained by connecting the input terminal (D) and the inverting output terminal (Q') of a D flip-flop), for dividing the inputted clock signal by 32. The control circuit K3 is used to provide the divide-by-4/5 control signal MC for the divide-by-4/5 counter K1 when the inverting output terminals of five T flip-flops T1, T2, T3, T4, T5 of the divide-by-32 counter K2 are all logic 1 and a mode control signal MODE is also 1 (that is, a period of the divide-by-32 counter K2).

In this example, when the mode control signal MODE is 0, the divide-by-4/5 control signal must be 0, at this time, the divide-by-4/5 counter divides the input clock IN by 4. And therefore, the divide-by-128/129 divides the input clock IN by 128 to obtain an output OUT. On the contrary, when the mode control signal is 1, the divide-by-4/5 control signal MC of the divide-by-4/5 counter K1 outputs a 1 every period of the divide-by-32 counter K2, the divide-by-4/5 counter K1 divides the input clock IN by 5 once every period of the divide-by-32 counter K2, therefore, the divide-by-128/129 counter in this case divides the input clock IN by 129.

For high-frequency signals that are transmitted and processed in the divide-by-4/5 counter K1, the operating frequency of the divide-by-128/129 counter is restricted by the divide-by-4/5 counter K1.

SUMMARY OF THE INVENTION

Therefore, an object of the present invention is to provide a divide-by-4/5 counter that comprises a half transparent register and a domino CMOS logic. In addition, the divide-by-4/5 counter can operate with low-power consumption at low operating voltage, and can be easily fabricated in CMOS technologies, therefore differing from the conventional art and possessing superior potential and higher operating speed.

The present invention provides a divide-by-4/5 counter. The divide-by-4/5 counter comprises a half transparent register, a domino logic, a buffer, a divide-by-4 counter and a control circuit.

Wherein the half transparent register comprises: a third NMOS transistor, wherein a gate and a source of the third NMOS transistor are respectively connected to an input clock and a negative voltage source; a third PMOS transistor, wherein a gate and a source of the third PMOS transistor are respectively connected to the input clock and a positive voltage source; a first inverter formed by serially connecting a first PMOS and NMOS transistor, wherein gates of the first PMOS and NMOS transistors are connected to serve as an input of the first inverter, drains of the first NMOS and PMOS transistors are connected to serve as an output of the first inverter, a source of the first PMOS transistor is connected to the positive voltage source, a source of the first NMOS transistor is connected to a drain of the third NMOS transistor; and a second inverter formed by serially connecting a second PMOS transistor and a second NMOS transistor, wherein gates of the second PMOS and NMOS transistors are connected to serve as an input of the second inverter, drains of the second PMOS and NMOS transistors are connected to serve as an output of the second inverter, the input of the second inverter is connected to the output of the first inverter, a source of the second PMOS transistor is connected to a drain of the third PMOS transistor, and the drain of the second PMOS transistor is connected to the negative voltage source.

The domino logic comprises: a fourth PMOS transistor, wherein a gate and a source of the fourth PMOS transistor are respectively connected to the input clock and the positive voltage source; a fourth NMOS transistor, wherein a gate and a source of the fourth NMOS transistor are respectively connected to the input clock and the negative voltage source; a first switch, wherein a control terminal is connected to the output of the second inverter; and a second switch coupled to the first switch, wherein an input terminal and an output terminal are respectively connected to a drain of the fourth PMOS transistor and a drain of the fourth NMOS transistor, and the drain of the fourth NMOS transistor is connected to the input of the first inverter.

The buffer is connected to a drain of the fourth PMOS transistor, for outputting a reference clock signal. The divide-by-4 counter comprises: a first divide-by-2 counter for dividing the reference clock signal by 2 so as to obtain a divide-by-2 clock signal; and a second divide-by-2 counter for dividing the divide-by-2 clock signal by 2 so as to obtain an output clock signal. The control circuit is connected to a control terminal of the second switch, for outputting a control signal of the domino logic according to the divide-by-2 clock signal, the output clock signal and a divide-by-4/5 control signal, whereby causing the input clock signal to be divided by 4 or 5.

Further, in the divide-by-4/5 counter of the present invention, the buffer can be an inverter. The first divide-by-2 counter may be a D flip-flop, wherein a clock terminal (CLK) of the D flip-flop is connected to the reference clock of the buffer, an input terminal (D) of the D flip-flop is connected to an inverting output (Q') of the D flip-flop. The second divide-by-2 counter may be a second D flip-flop, wherein a clock terminal (CLK) of the second D flip-flop is connected to the divide-by-2 clock of the D flip-flop, an input terminal (D) of the second D flip-flop is connected to an inverting output (Q') of the second D flip-flop.

And, in the divide-by-4/5 counter of the present invention, the D flip-flop may comprise: a fifth PMOS transistor, wherein a gate and a source of the fifth PMOS transistor are respectively connected to serve as the clock terminal (CLK) and an positive voltage source of the D flip-flop; a fifth NMOS transistor, wherein a gate and a source of the fifth NMOS transistor are respectively connected to serve as the input terminal (D) and an negative voltage source of the D flip-flop, and a drain of the fifth NMOS transistor is connected to a drain of the fifth PMOS transistor; a sixth PMOS transistor, wherein a gate and a source of the sixth PMOS transistor are respectively connected to the clock terminal (CLK) and the positive voltage source of the D flip-flop; a sixth NMOS transistor, wherein a gate and a source of the sixth NMOS transistor are respectively connected to the clock terminal (CLK) and the negative voltage source of the D flip-flop; a third switch, wherein an input terminal and an output terminal of the third switch are respectively connected to drains of the sixth PMOS and NMOS transistors, and the control terminal of the third switch is connected to the drain of the fifth PMOS transistor; a seventh PMOS transistor, wherein a gate and a source of the seventh PMOS transistor are respectively connected to the drain of the sixth PMOS transistor and the positive voltage source; a seventh NMOS transistor, wherein a gate and a source of the seventh NMOS transistor are respectively connected to the clock terminal (CLK) of the D flip-flop and the negative voltage source, a drain of the seventh NMOS transistor is connected to a drain of the seventh PMOS transistor to serve as an inverting output (Q') of the D flip-flop; and an inverter is connected to the drain of the seventh PMOS transistor for outputting an output (Q) of the D flip-flop.

Similarly, the second D flip-flop in the divide-by-4/5 counter of the present invention comprises: a fifth PMOS transistor, wherein a gate and a source of the fifth PMOS transistor are respectively connected to serve as the clock terminal (CLK) and an positive voltage source of the second D flip-flop; a fifth NMOS transistor, wherein a gate and a source of the fifth NMOS transistor are respectively connected to serve as the input terminal (D) and an negative voltage source of the second D flip-flop, and a drain of the fifth NMOS transistor is connected to a drain of the fifth PMOS transistor; a sixth PMOS transistor, wherein a gate and a source of the sixth PMOS transistor are respectively connected to the clock terminal (CLK) and the positive voltage source of the second D flip-flop; a sixth NMOS transistor, wherein a gate and a source of the sixth NMOS transistor are respectively connected to the clock terminal (CLK) and the negative voltage source of the second D flip-flop; a third switch, wherein an input terminal of the third switch and an output terminal of the third switch are respectively connected to drains of the sixth PMOS and NMOS transistors, and the control terminal of the third switch is connected to the drain of the fifth PMOS transistor; a seventh PMOS transistor, wherein a gate and a source of the seventh PMOS transistor are respectively connected to the drain of the sixth PMOS transistor and the positive voltage source; a seventh NMOS transistor, wherein a gate and a source of the seventh NMOS transistor are respectively connected to the clock terminal (CLK) of the second D flip-flop and the negative voltage source, a drain of the seventh NMOS transistor is connected to a drain of the seventh PMOS transistor as an inverting output (Q') of the second D flip-flop; and an inverter is connected to the drain of the seventh PMOS transistor for outputting an output (Q) of the second D flip-flop.

In addition, in the divide-by-4/5 counter of the present invention, the first switch may be a MOS transistor with its control terminal being a gate of the MOS transistor. The second switch may a MOS transistor with its control terminal being a gate of the MOS transistor. And the control circuit may be a NAND gate with three inputs being the divide-by-2 clock signal, the output clock signal and the divide-by-4/5 control signal.

BRIEF DESCRIPTION OF THE DRAWINGS

The following detailed description, given by way of example and not intended to limit the invention solely to the embodiments described herein, will best be understood in conjunction with the accompanying drawings, in which.

DESCRIPTION OF THE PREFERRED EMBODIMENT

Figure 1:
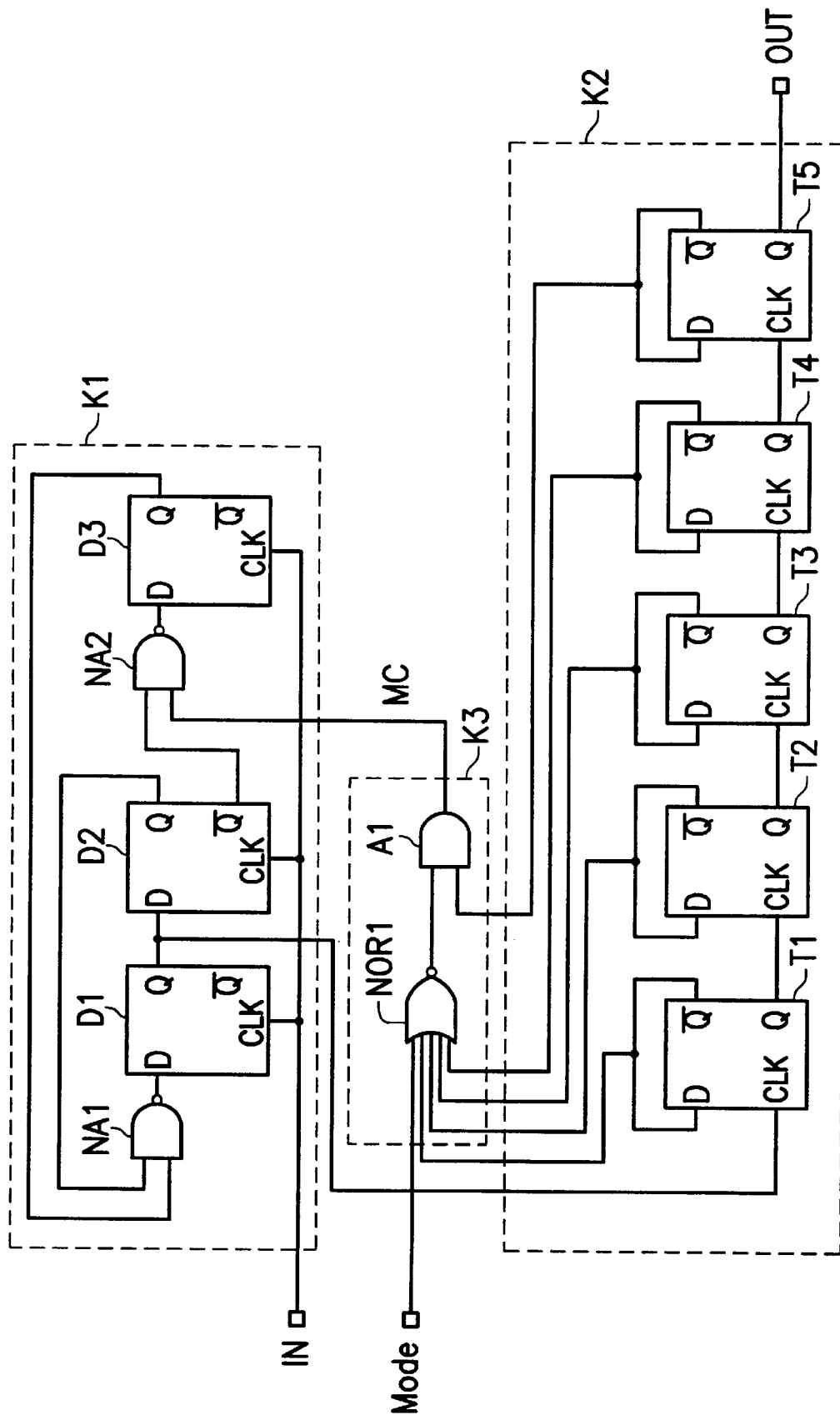
FIG. 1 (prior art) is a circuit diagram of a conventional divide-by-128/129 counter using CMOS technologies.
Figure 2:
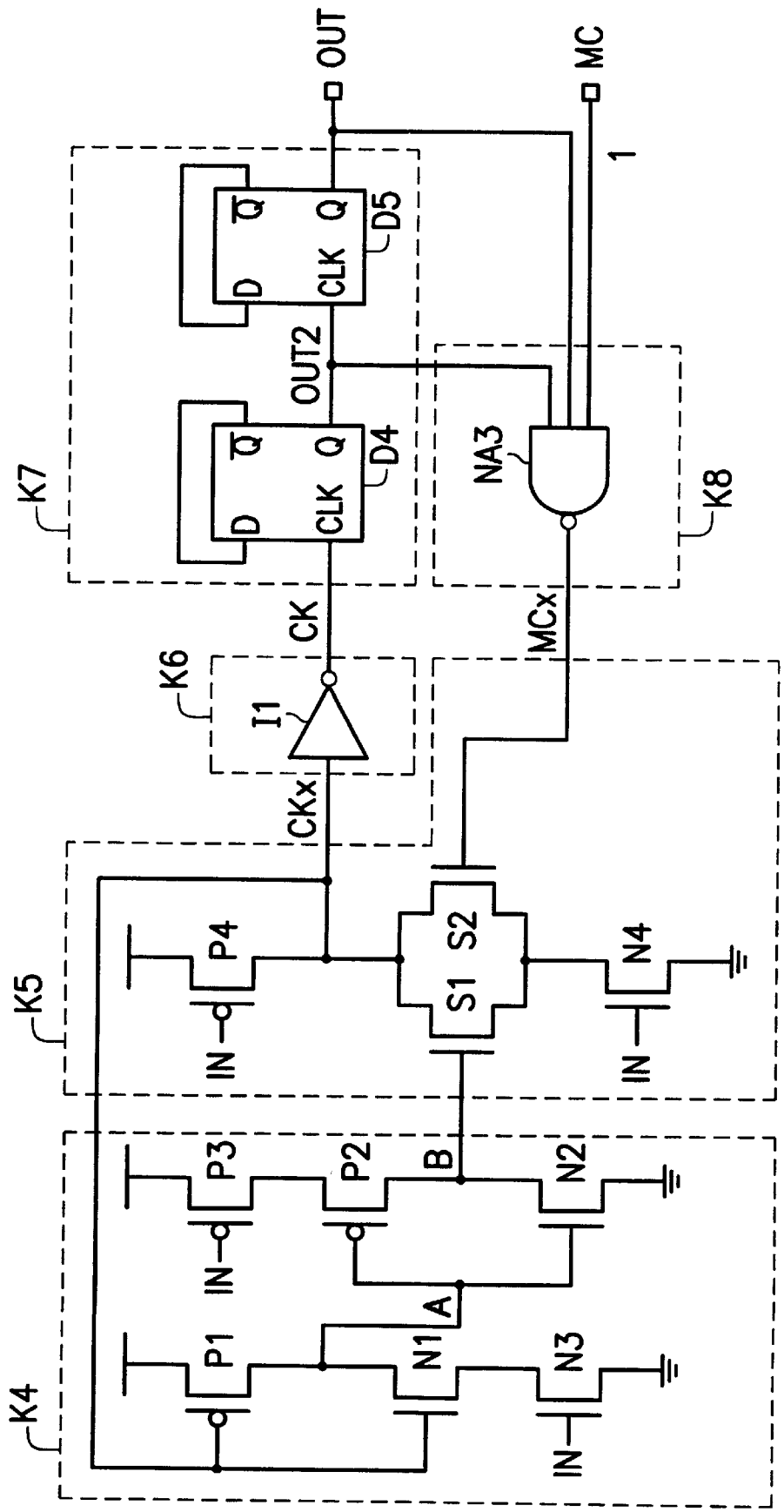
FIG. 2 is a circuit diagram of the divide-by-4/5 counter of the present invention.

FIG. 2 is a circuit diagram of the divide-by-4/5 counter of the present invention. The divide-by-4/5 counter comprises a half transparent register K4, a domino CMOS logic K5, a buffer K6, a divide-by-4 counter K7 and a control circuit K8.

The half transparent register K4 comprises three PMOS transistors and three NMOS transistors as shown in FIG. 2, wherein the gate and the source of the NMOS transistor N3 are respectively connected to the input clock IN and the negative voltage source; and the gate and the source of the PMOS transistor P3 are respectively connected to the input clock IN and the positive voltage source. The first inverter is formed by serially connecting a PMOS transistor P1 and a NMOS transistor N1 wherein the gates of the PMOS transistor P1 and the NMOS transistor N1 are connected as the input of the first inverter; the drains of the PMOS transistor P1 and the NMOS transistor N1 are connected to serve as the output of the first inverter; the source of the PMOS transistor P1 is connected to the positive voltage source; and the source of the NMOS transistor N1 is connected to the drain of the NMOS transistor N3. The second inverter is formed by serially connecting a PMOS transistor P2 and a NMOS transistor N2 wherein the gates of the PMOS transistor P2 and the NMOS transistor N2 are connected to serve as the input of the second inverter; the drains of the PMOS transistor P2 and the NMOS transistor N2 are connected to serve as the output of the second inverter; the input of the second inverter is connected to the output of the first inverter; the source of the PMOS transistor P2 is connected to the drain of the PMOS transistor P3; and the source of the NMOS transistor N2 is connected to the negative voltage source.

The domino CMOS logic K5 comprises a PMOS transistor, a NMOS transistor and two switches which can be MOS transistors wherein the gate and the source of the PMOS transistor P4 are respectively connected to the input clock IN and the positive voltage source; the gate and the source of the NMOS transistor are respectively connected to the input clock IN and the negative voltage source; and the control terminal of the switch S1 is connected to the output of the second inverter. The switch S2 is coupled to the switch S1, wherein the input and the output of the switch S2 are respectively connected to the drains of the PMOS transistor P4 and the NMOS transistor N4. The drain of the NMOS transistor is connected to the input of the first inverter.

In addition, the buffer K6 is connected to the drain of the PMOS transistor P4, for outputting a reference clock signal CK. The buffer K6 may be an inverter I1 to provide an impedance match and a more state reference clock signal CK.

The divide-by-4 counter K7 comprises a divide-by-2 counter D4 (the divide-by-2 counter D4 can be formed by connecting the input (D) and the inverting output (Q') of a D flip-flop) for dividing the reference clock signal CK by 2 to obtain a divide-by-2 clock signal OUT2, and a divide-by-2 counter D5 for dividing the divide-by-2 clock signal OUT2 by 2 to obtain an output clock signal OUT.

In addition, in the divide-by-4/5 counter, a control circuit K8 is provided for outputting a control signal MCx of the domino CMOS logic according to the divide-by-2 clock signal OUT2, the output clock signal OUT and a divide-by-4/5 control signal MC. The control signal MCx of the domino CMOS logic is connected to the control terminal of the switch S2.

In this embodiment, the control circuit may be a NAND gate NA3 with three inputs for outputting a pulse to the control terminal of the switch S2 when the divide-by-2 clock signal OUT2, the output clock signal OUT and the divide-by-4/5 control signal MC are all 1.

Figure 4:
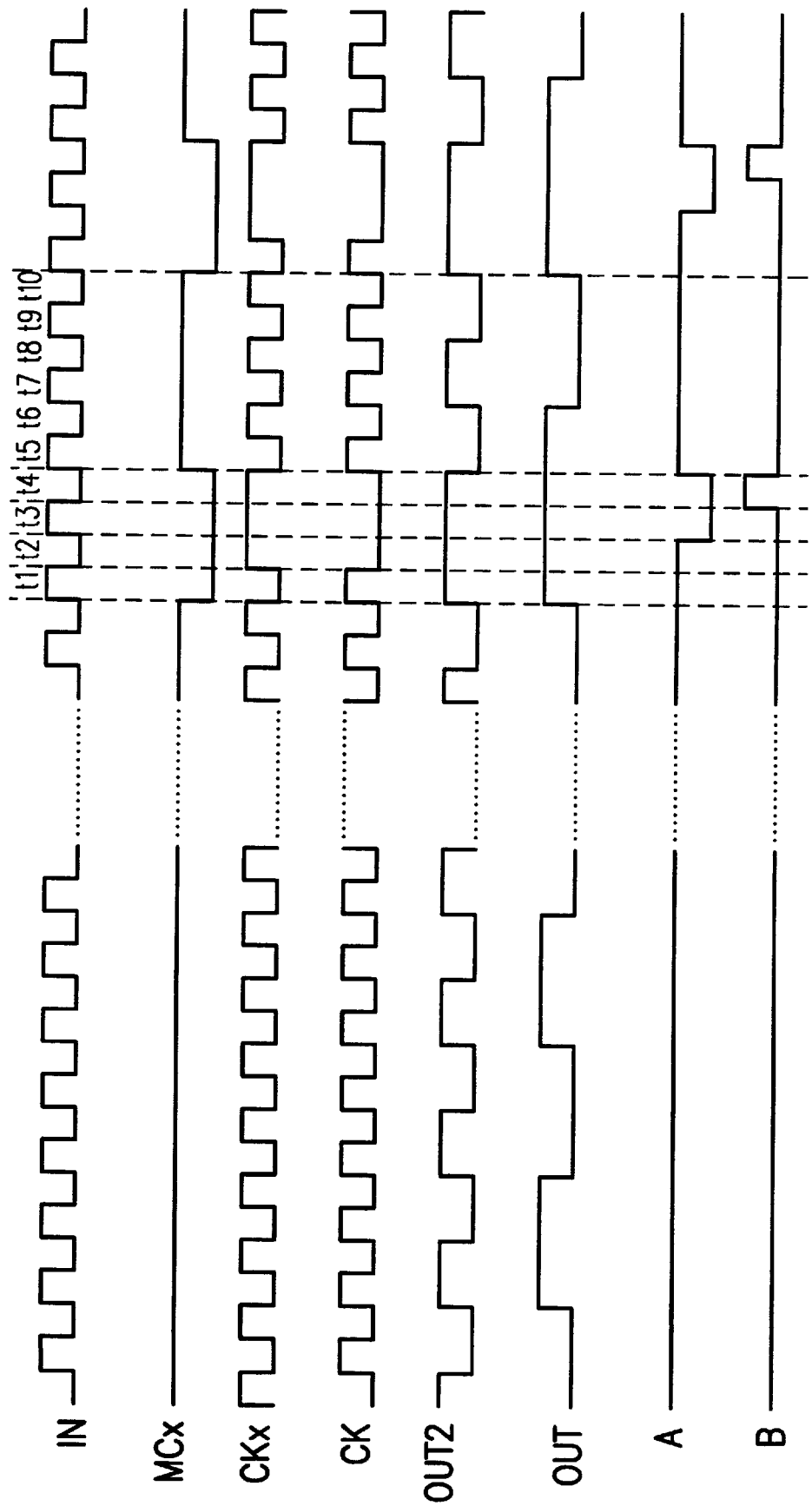
FIG. 4 is a time sequence showing the voltage level of each node in the divide-by-4/5 counter of the present invention in FIG. 2.

FIG. 4 depicts a time sequence showing the voltage level of each node in the divide-by-4/5 counter of the present invention in FIG. 2. What follows is a detailed description the operation of the divide-by-4/5 counter.

I. the divide-by-4/5 control signal MC is 0

When the divide-by-4/5 control signal MC is set to 0 (that is, the divide-by-4/5 counter divides the input clock IN by 4), the output of the control circuit K8 (the output of the NAND gate NA3) must be 1 and the switch must be on, therefore, the input of the buffer K6 (the input of the inverter I1) is the negative voltage source (logical 0) when the input clock signal IN is 1 (the NMOS transistor N4 is on, the PMOS transistor P4 is off), and is the positive voltage source (logical 1) when the input clock signal IN is 0 (the NMOS transistor N4 is off, the PMOS transistor P4 is on). Therefore, the phase of the input clock signal IN and that of the input of the buffer K6 (the inverter I1) is reversed; while the phase of the input clock signal IN and that of the output of the buffer K6 (the reference clock signal CK of the divide-by-4 counter K7) is the same.

The divide-by-4 counter K7, in this embodiment, is formed by serially connecting two divide-by-2 counters D4, D5 formed of D flip-flops, for dividing the reference clock signal CK (the output of the buffer K6) by 2 and again by 2 (therefore by 4) to obtain a divide-by-2 clock signal OUT2 and the output clock signal OUT.

In this case, the half-transparent register K4 does not perform for the divide-by-4/5 control signal MC and the output of the control circuit K8 are always 1. Further, node A (the drains of the PMOS transistor P1 and the NMOS transistor Ni) and node B (the drains of the PMOS transistor P2 and the NMOS transistor N2) also remain at logic 1's and logic 0's.

II. the divide-by-4/5 control signal MC is 1

When the divide-by-4/5 control signal MC goes 1 (that is, the divide-by-4/5 counter divides the input clock IN by 5), the output MCx of the control circuit K8 (the NAND gate NA3 with three inputs) is not necessarily 1 (the output MCx is 0 when the divide-by-2 clock signal OUT2 and the output clock signal OUT are both 1), therefore, the divide-by-4/5 counter divides the input clock signal IN by 5. The operation of the counter is then described as below.

Referring to FIG. 4, which depicts a time sequence showing the voltage level of each node in the divide-by-4/5 counter of the present invention in FIG. 2, when the divide-by-4/5 control signal MC is 1 (divide-by-2 clock signal OUT2 and the output clock signal OUT are not both 1), the output of the control circuit K8 (the NAND gate NA3 with three inputs) is 0, and the divide-by-4/5 counter divides the input clock signal IN by 4 as described above. However, when the divide-by-2 clock signal OUT2 and the output clock signal OUT simultaneously go to 1 as shown in the left part of FIG. 4 (for the logic values of the divide-by-2 clock signal OUT2 and the output clock signal OUT are repeated in the sequence of [0,1], [1,0], [0,0] and [1,1]):

first half-period t1

In this half-period t1, when the input clock signal IN is turning to logic 1, the input CKx and the output CK of the buffer K6 are respectively 0 and 1. Therefore, the NMOS transistor N3 is on, the first inverter (composed of the PMOS transistor P1 and the NMOS transistor N1) is used to invert the CKx and obtain the node A of logic 1. The second inverter (composed of the PMOS transistor P1 and the NMOS transistor N1) is at rest and obtain the node B of logic 0. At this time, the switches S1 and S2 are off, the PMOS transistor P3 is off, therefore, the input CKx of the buffer K6 is logic 0, the output CK of the buffer K6 is logic 1, the reference clock signal OUT2 and the output clock signal OUT of the divide-by-4 counter K7 are [1,1], the output MCx of the control circuit K8 is logic 0, the switch S2 is off, and the divide-by-4/5 control signal MC is still 1.

second half-period t2

In this half-period t2, when the input clock signal IN is turning to logic 0, the NMOS transistor N3 is off and the first inverter is at rest and the node A remains at logic 1. The PMOS transistor P3 is on and the second inverter is used to invert the node A and obtain the node B of logic 0. At this time, when the switches S1 and S2 are off, the PMOS transistor P4 is on, therefore, the input CKx of the buffer K6 is logic 1, the output CK of the buffer K6 is logic 0, the reference clock signal OUT2 and the output clock signal OUT of the divide-by-4 counter K7 are [1,1], the output MCx of the control circuit K8 is logic 0, the switch S2 is off, and the divide-by-4/5 control signal MC is still 1.

third half-period t3

In this half-period t3, when the input clock signal IN is again turning to logic 1, the NMOS transistor N3 is on and the first inverter is used to invert the. CKx and obtain the node A of logic 0. The PMOS transistor P3 is off and the second inverter is at rest and retains the node B of logic 0. At this time, when the switches S1 and S2 are off, the PMOS transistor P4 is off, therefore, the input CKx of the buffer K6 is logic 1, the output CK of the buffer K6 is logic 0, the reference clock signal OUT2 and the output clock signal OUT of the divide-by-4 counter K7 are [1,1], the output MCx of the control circuit K8 is logic 0, the switch S2 is off, and the divide-by-4/5 control signal MC is still 1.

fourth half-period t4

In this half-period t4, when the input clock signal IN is again turning to logic 0, the NMOS transistor N3 is off and the first inverter is at rest and retains the node A of logic 0. The PMOS transistor P3 is on and the second inverter is used to invert the node A and obtain the node B of logic 1. At this time, when the switch S1 is on and the NMOS transistor N4 is on, therefore, the input CKx of the buffer K6 is logic 0, the output CK of the buffer K6 is logic 1. Further, when a rising edge occurs at the input of the divide-by-4 counter K7, the reference clock signal OUT2 and the output clock signal OUT of the divide-by-4 counter K7 are turning to [0,1] from [1,1], the output MCx of the control circuit K8 goes back to logic 1, and the divide-by-4/5 control signal MC goes back to 0.

After these, the divide-by-4/5 counter according to the present invention can again divide the input clock signal IN by 4 as mentioned above. As a result, the divide-by-4/5 counter can delay one period at each time the divide-by-2 clock signal OUT2 and the output clock signal OUT goes to [1,1] through the half-transparent register K4 and the domino CMOS logic K5 (a period of the divide-by-2 clock signal OUT2 and the output clock signal OUT is four period), the divide-by-4/5 can divide the input clock signal IN by 5.

Figure 3:
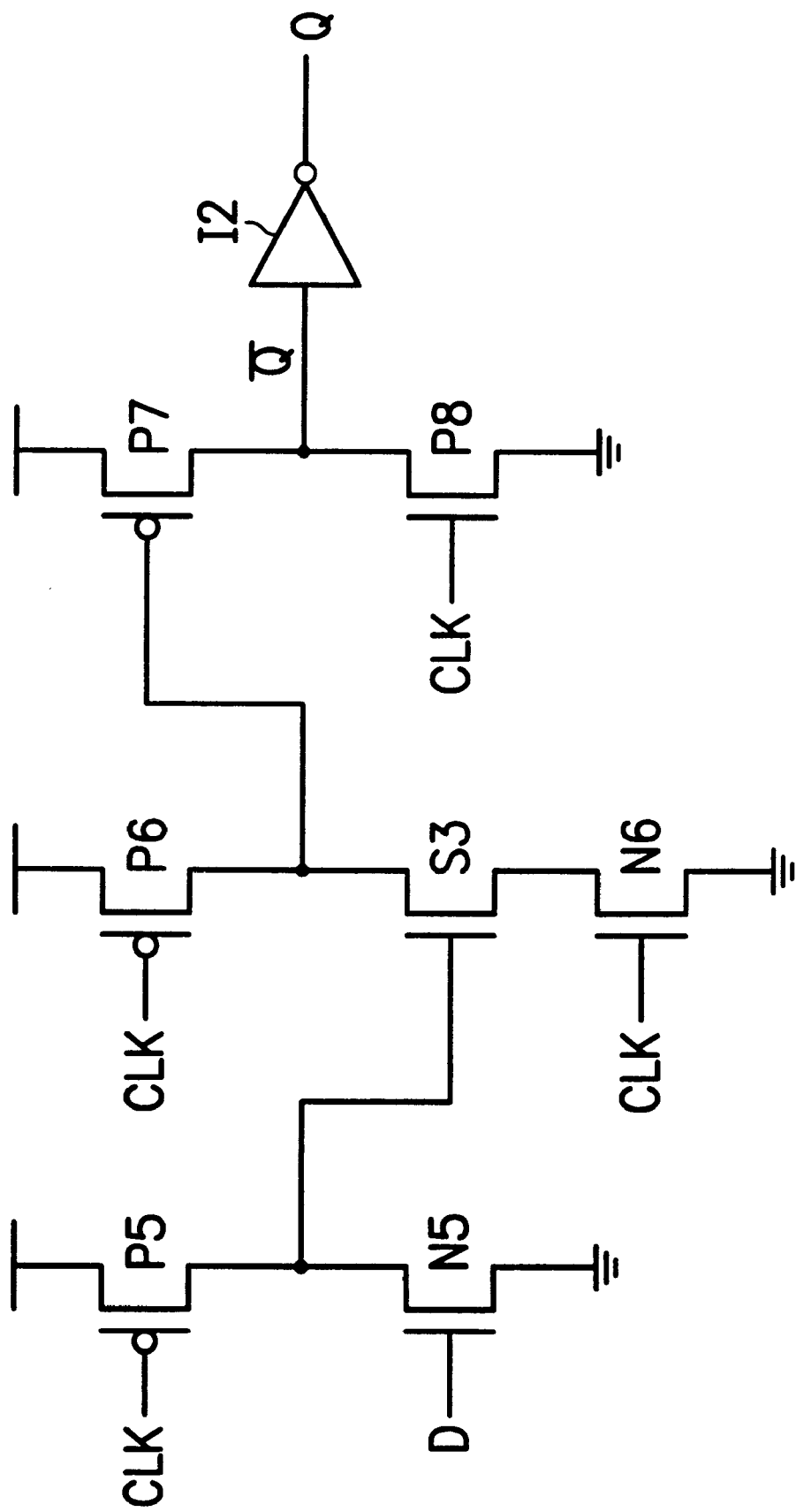
FIG. 3 is a circuit diagram of the D flip-flop in the divide-by-4/5 counter of the present invention.

Further, to improve the operating frequency of the D flip-flops used in this invention, which restricts the operating frequency of the divide-by-4/5 counter, the D flip-flops D4, D5 of the present invention are provided as shown in FIG. 3.

In FIG. 3, the D flip-flop comprises three PMOS transistors P5, P6, P7, three NMOS transistors N5, N6, N7, a switch S3 (formed by a MOS transistor) and an inverter I2, wherein the gate and the source of the PMOS transistor P5 are respectively connected to the clock terminal (CLK) and the positive voltage source of the D flip-flop; the gate and the source of the NMOS transistor N5 are respectively connected to serve as the input terminal (D) and the positive voltage source of the D flip-flop; the drain of the NMOS transistor N5 is connected to the drain of the PMOS transistor P5; the gate and the source of the PMOS transistor P6 are respectively connected to serve as the clock (CLK) and the positive voltage source of the D flip-flop; the gate and the source of the NMOS transistor N6 are respectively connected to serve as the clock terminal (CLK) and the negative voltage source; the input terminal and the output terminal of the switch S3 are respectively connected to the drains of the PMOS transistor P6 and the NMOS transistor N6, and the control terminal of the switch S3 is connected to the drain of the PMOS transistor P5; the gate and the source of the PMOS transistor P7 are respectively connected to the drain of the PMOS transistor P6 and the positive voltage source; the gate and the source of the NMOS transistor N7 are respectively connected to the clock terminal (CLK) and the negative voltage source; the drain of the NMOS transistor N7 is connected to the drain of the PMOS transistor as the inverting output (Q') of the D flip-flop; and, the input of the inverter I2 is connected to the drain of the PMOS transistor P7 to obtain the output (Q) of the D flip-flop.

Therefore, seven transistors (including the second inverter I2) can be used to provide a D flip-flop with a higher operating frequency than the conventional art, and require two fewer transistors than the TSPC D flip-flop introduced by YUAN and SVENSSON.

For purpose of analysis, when applying the divide-by-4/5 counter of the present invention in the divide-by-128/129 counter of the conventional art, the operating frequency is 1.1 GHz, the power consumption is 19.2 mW with 51% in the divide-by-4/5 counter when the voltage source is 3V. Further, when the voltage source is 5V, 42% power is consumed in the divide-by-4/5 counter. The divide-by-4/5 counter can also operate at a voltage source as low as 1.5V.

In summary, the divide-by-4/5 counter can be fabricated with CMOS technologies, which provides higher integration density, lower power consumption, and a higher operating frequency. Therefore, it can be adopted by most semiconductor vendors. Further, the need for less combination logic and use of a simplified design also increase the operating frequency and decrease the delay.

In addition, the present invention can be applied and used to improve the operating frequency of most divide-by-32/33 counters, divide-by-64/65 counters, and divide-by-128/129 counters, which are also restricted by the divide-by-4/5 counter.

The foregoing description of a preferred embodiment of the present invention has been provided for the purposes of illustration and description only. It is not intended to be exhaustive or to limit the invention to the precise forms disclosed. Many modifications and variations will be apparent to practitioners skilled in this art. The embodiment was chosen and described to best explain the principles of the present invention and its practical application, thereby enabling those who are skilled in the art to understand the invention in terms of various embodiments and with various modifications as are suited to the particular use contemplated. It is intended that the scope of the invention be defined by the following claims and their equivalents.

What is claimed is:

1. A divide-by-4/5 counter, consisting of:
    a half transparent register, comprising:
        a third NMOS transistor, wherein a gate of the third NMOS transistor and a source of the third NMOS transistor are respectively connected to an input clock and a negative voltage source;
        a third PMOS transistor, wherein a gate of the third PMOS transistor and a source of the third PMOS transistor are respectively connected to the input clock and a positive voltage source;
        a first inverter formed by serially connecting a first PMOS transistor and a first NMOS transistor, wherein a gate of the first PMOS transistor and a gate of the first NMOS transistor are connected to serve as an input of the first inverter, a drain of the first NMOS transistor and a drain of the first PMOS transistor are connected to serve as an output of the first inverter, a source of the first PMOS transistor is connected to the positive voltage source, and a source of the first NMOS transistor is connected to a drain of the third NMOS transistor; and
        a second inverter formed by serially connecting a second PMOS transistor and a second NMOS transistor, wherein a gate of the second PMOS transistor and a gate of the second NMOS transistor are connected to serve as an input of the second inverter, a drain of the second PMOS transistor and a drain of the second NMOS transistor are connected to serve as an output of the second inverter, the input of the second inverter is connected to the output of the first inverter, and a source of the second PMOS transistor is connected to a drain of the third PMOS transistor, the drain of the second PMOS transistor is connected to the negative voltage source through said second NMOS transistor;
    a domino logic, comprising:
        a fourth PMOS transistor, wherein a gate of the fourth PMOS transistor and a source of the fourth PMOS transistor are respectively connected to the input clock and the positive voltage source;
        a fourth NMOS transistor, wherein a gate of the fourth NMOS transistor and a source of the fourth NMOS transistor are respectively connected to the input clock and the negative voltage source;
        a first switch, wherein a control terminal is connected to the output of the second inverter; and
        a second switch coupled to the first switch, wherein an input terminal of the second switch and an output terminal of the second switch are respectively connected to a drain of the fourth PMOS transistor and a drain of the fourth NMOS transistor, and the drain of the fourth NMOS transistor is connected to the input of the first inverter through said first switch and second switch;
        a buffer connected to a drain of the fourth PMOS transistor, for outputting a reference clock signal;

a divide-by-4 counter, comprising:
- a first divide-by-2 counter for dividing the reference clock signal by 2 so as to obtain a divide-by-2 clock signal; and
- a second divide-by-2 counter for dividing the divide-by-2 clock signal by 2 so as to obtain an output clock signal; and
- a control circuit connected to a control terminal of the second switch, for outputting a control signal of the domino logic according to the divide-by-2 clock signal, the output clock signal and a divide-by-4/5 control signal;

whereby the input clock signal is divided by 4/5.

2. The divide-by-4/5 counter as claimed in claim 1, wherein the buffer is an inverter.

3. The divide-by-4/5 counter as claimed in claim 1, wherein the first divide-by-2 counter is a D flip-flop, wherein a clock terminal (CLK) of the D flip-flop is connected to the reference clock of the buffer, an input terminal (D) of the D flip-flop is connected to an inverting output (Q') of the D flip-flop.

4. The divide-by-4/5 counter as claimed in claim 3, wherein the second divide-by-2 counter is a second D flip-flop, wherein a clock terminal (CLK) of the second D flip-flop is connected to the divide-by-2 clock of the D flip-flop, an input terminal (D) of the second D flip-flop is connected to an inverting output (Q') of the second D flip-flop.

5. The divide-by-4/5 counter as claimed in claim 4, wherein the D flip-flop comprises:
- a fifth PMOS transistor, wherein a gate of the fifth PMOS transistor and a source of the fifth PMOS transistor are respectively connected to serve as the clock terminal (CLK) and an positive voltage source of the D flip-flop;
- a fifth NMOS transistor, wherein a gate of the fifth NMOS transistor and a source of the fifth NMOS transistor are respectively connected to serve as the input terminal (D) and an negative voltage source of the D flip-flop, and a drain of the fifth NMOS transistor is connected to a drain of the fifth PMOS transistor;
- a sixth PMOS transistor, wherein a gate of the sixth PMOS transistor and a source of the sixth PMOS transistor are respectively connected to the clock terminal (CLK) and the positive voltage source of the D flip-flop;
- a sixth NMOS transistor, wherein a gate of the sixth NMOS transistor and a source of the sixth NMOS transistor are respectively connected to the clock terminal (CLK) and the negative voltage source of the D flip-flop;
- a third switch, wherein an input terminal of the third switch and an output terminal of the third switch are respectively connected to a drain of the sixth PMOS transistor and a drain of the sixth NMOS transistor, and a control terminal of the third switch is connected to the drain of the fifth PMOS transistor;
- a seventh PMOS transistor, wherein a gate of the seventh PMOS transistor and a source of the seventh PMOS transistor are respectively connected to the drain of the sixth PMOS transistor and the positive voltage source;
- a seventh NMOS transistor, wherein a gate of the seventh NMOS transistor and a source of the seventh NMOS transistor are respectively connected to the clock terminal (CLK) of the D flip-flop and the negative voltage source, and a drain of the seventh NMOS transistor is connected to a drain of the seventh PMOS transistor to serve as an inverting output (Q') of the D flip-flop; and
- an inverter connected to the drain of the seventh PMOS transistor for outputting an output (Q) of the D flip-flop.

6. The divide-by-4/5 counter as claimed in claim 4, wherein the second D flip-flop comprises:
- a fifth PMOS transistor, wherein a gate of the fifth PMOS transistor and a source of the fifth PMOS transistor are respectively connected to serve as the clock terminal (CLK) and an positive voltage source of the second D flip-flop;
- a fifth NMOS transistor, wherein a gate of the fifth NMOS transistor and a source of the fifth NMOS transistor are respectively connected to serve as the input terminal (D) and an negative voltage source of the second D flip-flop, and a drain of the fifth NMOS transistor is connected to a drain of the fifth PMOS transistor;
- a sixth PMOS transistor, wherein a gate of the sixth PMOS transistor and a source of the sixth PMOS transistor are respectively connected to the clock terminal (CLK) and the positive voltage source of the second D flip-flop;
- a sixth NMOS transistor, wherein a gate of the sixth NMOS transistor and a source of the sixth NMOS transistor are respectively connected to the clock terminal (CLK) and the negative voltage source of the second D flip-flop;
- a third switch, wherein an input terminal of the third switch and an output terminal of the third switch are respectively connected to a drain of the sixth PMOS transistor and a drain of the sixth NMOS transistor, and a control terminal of the third switch is connected to the drain of the fifth PMOS transistor;
- a seventh PMOS transistor, wherein a gate of the seventh PMOS transistor and a source of the seventh PMOS transistor are respectively connected to the drain of the sixth PMOS transistor and the positive voltage source;
- a seventh NMOS transistor, wherein a gate of the seventh NMOS transistor and a source of the seventh NMOS transistor are respectively connected to the clock terminal (CLK) of the second D flip-flop and the negative voltage source, and a drain of the seventh NMOS transistor is connected to a drain of the seventh PMOS transistor to serve as an inverting output (Q') of the second D flip-flop; and
- an inverter connected to the drain of the seventh PMOS transistor for outputting an output (Q) of the second D flip-flop.

7. The divide-by-4/5 counter as claimed in claim 1, wherein the first switch is a MOS transistor, and the control terminal of the first switch is a gate of the MOS transistor.

8. The divide-by-4/5 counter as claimed in claim 1, wherein the second switch is a MOS transistor, and the control terminal of the second switch is a gate of the MOS transistor.

9. The divide-by-4/5 counter as claimed in claim 1, wherein the control circuit is a NAND gate, and three inputs of the NAND gate are the divide-by-2 clock signal, the output clock signal and the divide-by-4/5 control signal.

* * * * *

UNITED STATES PATENT AND TRADEMARK OFFICE
CERTIFICATE OF CORRECTION

PATENT NO. : 5,930,322
DATED : 7/27/99
INVENTOR(S) : Yang et al.

It is certified that error appears in the above-identified patent and that said Letters Patent is hereby corrected as shown below:

Column 1, line 8, after "voltage" delete --,--

Column 1, line 12, after "systems" delete --,--

Column 1, line 39, (second occurrence) after "0" delete "," and insert --.--

Column 1, line 39, change "at" to --At--

Column 1, line 39, after "time' delete --,--

Column 2, line 1, delete "Wherein" and change "the" to --The--

Column 2, line 40, after "transistor" delete --,--

Column 2, line 46, after "switch" delete --,--

Column 3, line 61, after "invention" delete --,--

Column 3, line 64, delete "And" and insert --The--

Column 4, line 54, after "source" change ";" to --.--

Column 4, line 54, change "the" (second occurrence) to --The--

UNITED STATES PATENT AND TRADEMARK OFFICE
CERTIFICATE OF CORRECTION

PATENT NO. : 5,930,322

DATED : 7/27/99

INVENTOR(S) : Yang et al.

It is certified that error appears in the above-identified patent and that said Letters Patent is hereby corrected as shown below:

Column 4, line 64, after "P4" delete --,--

Column 5, line 24, change "the" to --The--

Column 5, line 36, after "reversed" change ";" to --,--

Column 5, line 53, change "the" to --The--

Signed and Sealed this

Twentieth Day of June, 2000

*Attest:*

Q. TODD DICKINSON

*Attesting Officer*     *Director of Patents and Trademarks*